United States Patent
Franck et al.

(10) Patent No.: US 10,686,528 B2
(45) Date of Patent: Jun. 16, 2020

(54) METHODS AND APPARATUS FOR TUNING LOOKUP TABLE CIRCUITS IN A TRANSMITTER OF OPTICAL AND ELECTRICAL COMMUNICATION SYSTEMS

(71) Applicant: Mellanox Technologies Denmark ApS., Roskilde (DK)

(72) Inventors: Thorkild Franck, Roskilde (DK); Bjarke Vad Pedersen, Roskilde (DK); Johan Jacob Mohr, Copenhagen (DK); Eyal David, Atzmon (IL); Juan Jose Vegas Olmos, Søborg (DK)

(73) Assignee: MELLANOX TECHNOLOGIES DENMARK APS., Roskilde (DK)

( * ) Notice: Subject to any disclaimer, the term of this patent is extended or adjusted under 35 U.S.C. 154(b) by 0 days.

(21) Appl. No.: 16/182,964

(22) Filed: Nov. 7, 2018

(65) Prior Publication Data
US 2020/0145111 A1   May 7, 2020

(51) Int. Cl.
*H04B 10/54* (2013.01)
*H01S 5/42* (2006.01)
*H04B 10/58* (2013.01)
*H04B 10/524* (2013.01)

(52) U.S. Cl.
CPC ........... *H04B 10/541* (2013.01); *H01S 5/423* (2013.01); *H04B 10/524* (2013.01); *H04B 10/58* (2013.01)

(58) Field of Classification Search
None
See application file for complete search history.

(56) References Cited

U.S. PATENT DOCUMENTS

| | | | |
|---|---|---|---|
| 2008/0226289 A1* | 9/2008 | Meyer | G01M 11/00 398/16 |
| 2015/0093117 A1* | 4/2015 | Rahn | H04B 10/588 398/115 |

FOREIGN PATENT DOCUMENTS

EP         2214331 A1 *  8/2010  .......... H04B 10/079

* cited by examiner

*Primary Examiner* — David W Lambert
(74) *Attorney, Agent, or Firm* — Alston & Bird LLP (57) ABSTRACT

Embodiments are disclosed for generating a lookup table value for calibrating a lookup table circuit in an optical transmitter. The example method includes generating a calibration signal. The calibration signal encodes a plurality of bits in a number of amplitude levels. The example method further includes transmitting the calibration signal to a module under calibration and transmitting a symbol sequence of defined length to a reference module. The reference module compares the symbol sequence with a distorted signal received from the module under calibration to generate a set of condition count statistics. The example method further includes receiving the set of condition count statistics from the receiver in the reference module and calculating a lookup table value based on the set of condition count statistics. The example method further includes transmitting the lookup table value to a transmitter associated with the module under calibration.

20 Claims, 8 Drawing Sheets

|  | Triplet of symbols | | | |
|---|---|---|---|---|
| index | k-1 | k | k+1 | output |
| 1 | 0 | 0 | 0 | 1/127 |
| 2 | 0 | 0 | 1 | 2/127 |
| 3 | 0 | 0 | 2 | |
| 4 | 0 | 0 | 3 | |
| 5 | 0 | 1 | 0 | |
| 6 | 0 | 1 | 1 | 29/127 |
| 7 | 0 | 1 | 2 | |
| 8 | 0 | 1 | 3 | |
| 9 | 0 | 2 | 0 | 65/127 |
| 10 | 0 | 2 | 1 | |
| 11 | 0 | 2 | 2 | |
| 12 | 0 | 2 | 3 | |
| 13 | 0 | 3 | 0 | 94/127 |
| 14 | 0 | 3 | 1 | |
| 15 | 0 | 3 | 2 | |
| 16 | 0 | 3 | 3 | |
| 17 | 1 | 0 | 0 | 0/127 |
| 18 | 1 | 0 | 1 | |
| 19 | 1 | 0 | 2 | |
| 20 | 1 | 0 | 3 | |
| 21 | 1 | 1 | 0 | |
| 22 | 1 | 1 | 1 | |
| 23 | 1 | 1 | 2 | |
| 24 | 1 | 1 | 3 | |
| 25 | 1 | 2 | 0 | |
| 26 | 1 | 2 | 1 | |
| 27 | 1 | 2 | 2 | |
| 28 | 1 | 2 | 3 | |
| 29 | 1 | 3 | 0 | |
| 30 | 1 | 3 | 1 | |
| 31 | 1 | 3 | 2 | |
| 32 | 1 | 3 | 3 | |
| 33 | 2 | 0 | 0 | |
| 34 | 2 | 0 | 1 | |
| 35 | 2 | 0 | 2 | |
| 36 | 2 | 0 | 3 | |
| 37 | 2 | 1 | 0 | |
| 38 | 2 | 1 | 1 | |
| 39 | 2 | 1 | 2 | |
| 40 | 2 | 1 | 3 | |
| 41 | 2 | 2 | 0 | |
| 42 | 2 | 2 | 1 | |
| 43 | 2 | 2 | 2 | |
| 44 | 2 | 2 | 3 | |
| 45 | 2 | 3 | 0 | |
| 46 | 2 | 3 | 1 | |
| 47 | 2 | 3 | 2 | |
| 48 | 2 | 3 | 3 | |
| 49 | 3 | 0 | 0 | |
| 50 | 3 | 0 | 1 | |
| 51 | 3 | 0 | 2 | |
| 52 | 3 | 0 | 3 | |
| 53 | 3 | 1 | 0 | |
| 54 | 3 | 1 | 1 | |
| 55 | 3 | 1 | 2 | |
| 56 | 3 | 1 | 3 | |
| 57 | 3 | 2 | 0 | |
| 58 | 3 | 2 | 1 | |
| 59 | 3 | 2 | 2 | |
| 60 | 3 | 2 | 3 | |
| 61 | 3 | 3 | 0 | |
| 62 | 3 | 3 | 1 | |
| 63 | 3 | 3 | 2 | |
| 64 | 3 | 3 | 3 | |

METHODS AND APPARATUS FOR TUNING LOOKUP TABLE CIRCUITS IN A TRANSMITTER OF OPTICAL AND ELECTRICAL COMMUNICATION SYSTEMS

TECHNOLOGICAL FIELD

Embodiments of the present invention relate generally to a method and apparatus for tuning a lookup table circuit in a transmitter of an optical and electrical communication system.

BACKGROUND

The present invention relates to a method and apparatus for tuning a lookup table circuit in a transmitter of an optical and electrical communication system. Communication systems are generally composed of a transmitter, a receiver, and a channel of which all may distort the signal. The transmitter generates a signal conveying information, which, after being transmitted over a channel, is received and recovered at the receiver. For optical based communications such as communications using vertical cavity surface emitting lasers (VCSELs), electro-absorption modulated lasers (EMLs), or directly modulated lasers (DMLs), the lasers are typically nonlinear laser sources. Further, distortion may be introduced in the electrical or optical transmission process because of reflections, linear and nonlinear channel impairments, or the like. When the nonlinear laser sources are used to transmit optical signals via a nonlinear channel to encode information in different amplitude levels (such as pulse amplitude modulation with 4 levels, "PAM-4"), the integrity of the communication can be compromised.

Lookup table circuits with configurable lookup table values are used in an optical transmitter to compensate for these nonlinearities. The lookup table circuits utilizes a suitable set of lookup table values to implement compensation into the optical transmitter. The look up table circuit may be a single lookup table or a combination of look up tables. The values of the look up tables may be mapped into the physical implementation of the lookup table circuit through firmware or software.

For the purpose of finding a suitable set of lookup table values, dedicated high cost measurement equipment having a high-speed sampling scope with pattern lock functionality or a real-time scope with large memory are commonly utilized. Such dedicated high cost measurement equipment can impose a heavy burden on the manufacturing process for producing optical transmitters. Therefore, a solution for finding a suitable set of lookup table values without using dedicated measurement equipment is preferred and needed.

BRIEF SUMMARY

Example embodiments of the present invention relate generally to a method and apparatus for tuning a lookup table circuit in a transmitter of an optical and electrical communication system. The details of some embodiments of the subject matter described in this specification are set forth in the accompanying drawings and the description below. Other features, aspects, and advantages of the subject matter will become apparent from the description, the drawings, and the claims.

In accordance with an example embodiment, a method for generating a lookup table value for calibrating a lookup table circuit in an optical transmitter is provided. The method includes generating a calibration signal. The calibration signal encodes a plurality of bits in a number of amplitude levels. The method further includes transmitting the calibration signal to a module under calibration. The method further includes transmitting a symbol sequence with a defined length to a reference module. The reference module is configured to compare the symbol sequence with the defined length with a distorted signal received from the module under calibration to generate a set of condition count statistics. The method further includes receiving the set of condition count statistics from the receiver in the reference module. The method further includes calculating a lookup table value based on the set of condition count statistics. The method further includes transmitting the lookup table value to a transmitter associated with the module under calibration.

In some implementations of such a method, the calibration signal is a pulse amplitude modulation signal encoding the plurality of symbols in four amplitude levels and the calibration signal is encoded in a plurality of triplets. In some embodiments, the distorted signal includes three eyes, and the reference module includes a histogram slicer configured to slice the distorted signal, three slicer modules configured to slice the distorted signal to generate three distorted symbol values, and a detection module. The detection module includes three symbol comparators configured to compare three transmitted symbol values from the symbol sequence with the three distorted symbol values and a first AND gate configured to receive three outputs from the three symbol comparators. An output of the first AND gate is a condition flag. The reference module further includes a first counter configured to count the condition flag over the period of time to generate a set of condition counts. The reference module further includes a second AND gate configured to receive the condition flag and the output of the histogram slicer. The reference module further includes a second counter configured to count the output of the second AND gate.

In some embodiments, the distorted signal comprises three eyes, and the reference module includes: a histogram slicer configured to slice the distorted signal, three slicer modules configured to slice the distorted signal to generate three distorted symbol values, and one or more detection modules. Each detection module includes three symbol comparators configured to compare three transmitted symbol values from the symbol sequence with the three distorted symbol values and a first AND gate configured to receive three outputs from the three symbol comparators. The reference module further includes an OR gate configured to receive the output of each of the first AND gates of the one or more detection modules, wherein an output of the OR gate is a condition flag. The reference module further includes a first counter configured to count the condition flag over the period of time to generate a set of condition counts. The reference module further includes a second AND gate configured to receive the condition flag and the output of the histogram slicer. The reference module further includes a second counter configured to count the output of the second AND gate. In some embodiments, the distorted signal is generated by the module under calibration based on the calibration signal. In some embodiments, the period of time is one of: a predefined period of time or a period of time determined based on a pre-defined statistics condition for the set of condition flags. In some embodiments, the module under calibration includes a receiver and a transmitter; the transmitter includes a laser driver circuit; and the laser driver circuit includes a lookup table circuit. In some embodiments, the method further includes generating sixty four lookup table values.

In accordance with another example embodiment, an apparatus for generating a lookup table value for calibrating a lookup table circuit in an optical transmitter is provided. The apparatus is configured to generate a calibration signal. The calibration signal encodes a plurality of bits in a number of amplitude levels. The apparatus is further configured to transmit the calibration signal to a module under calibration. The apparatus is further configured to transmit a symbol sequence with a defined length to a reference module. The reference module is configured to compare the symbol sequence with the defined length with a distorted signal received from the module under calibration to generate a set of condition count statistics. The apparatus is further configured to receive the set of condition count statistics from the receiver in the reference module. The apparatus is further configured to calculate a lookup table value based on the set of condition count statistics. The apparatus is further configured to transmit the lookup table value to a transmitter associated with the module under calibration.

In some implementations of such an apparatus, the calibration signal is a pulse amplitude modulation signal encoding the plurality of symbols in four amplitude levels and the calibration signal is encoded in a plurality of triplets. In some embodiments, the distorted signal includes three eyes, and the reference module includes a histogram slicer configured to slice the distorted signal, three slicer modules configured to slice the distorted signal to generate three distorted symbol values, and a detection module. The detection module includes three symbol comparators configured to compare three transmitted symbol values from the symbol sequence with the three distorted symbol values and a first AND gate configured to receive three outputs from the three symbol comparators. An output of the first AND gate is a condition flag. The reference module further includes a first counter configured to count the condition flag over the period of time to generate a set of condition counts. The reference module further includes a second AND gate configured to receive the condition flag and the output of the histogram slicer. The reference module further includes a second counter configured to count the output of the second AND gate.

In some embodiments, the distorted signal comprises three eyes, and the reference module includes: a histogram slicer configured to slice the distorted signal, three slicer modules configured to slice the distorted signal to generate three distorted symbol values, and one or more detection modules. Each detection module includes three symbol comparators configured to compare three transmitted symbol values from the symbol sequence with the three distorted symbol values and a first AND gate configured to receive three outputs from the three symbol comparators. The reference module further includes an OR gate configured to receive the output of each of the first AND gates of the one or more detection modules, wherein an output of the OR gate is a condition flag. The reference module further includes a first counter configured to count the condition flag over the period of time to generate a set of condition counts. The reference module further includes a second AND gate configured to receive the condition flag and the output of the histogram slicer. The reference module further includes a second counter configured to count the output of the second AND gate. In some embodiments, the distorted signal is generated by the module under calibration based on the calibration signal. In some embodiments, the period of time is one of: a predefined period of time or a period of time determined based on a pre-defined statistics condition for the set of condition flags. In some embodiments, the module under calibration includes a receiver and a transmitter; the transmitter includes a laser driver circuit; and the laser driver circuit includes a lookup table circuit. In some embodiments, the apparatus is further configured to generate sixty four lookup table values.

In accordance with yet another example embodiment, an apparatus for generating condition statistics used for generating a lookup table value for calibrating a lookup table circuit in an optical transmitter is provided. The apparatus includes a histogram slicer configured to slice a distorted signal. The apparatus further includes three slicer modules configured to slice the distorted signal to generate three distorted symbol values. The apparatus further includes a detection module. The detection module includes three symbol comparators configured to compare three transmitted symbol values from a symbol triplet with the three distorted symbol values and a first AND gate configured to receive three outputs from the three symbol comparators, wherein an output of the first AND gate is a condition flag. The apparatus further includes a first counter configured to count the condition flag over the period of time to generate a set of condition counts. The apparatus further includes a second AND gate configured to receive the condition flag and the output of the histogram slicer. The apparatus further includes a second counter configured to count the output of the second AND gate.

In some implementations of such an apparatus, the calibration signal is a pulse amplitude modulation signal encoding the plurality of symbols in four amplitude levels, and the calibration signal is encoded in a plurality of triplets. In some embodiments, the distorted signal comprises three eyes. In some embodiments, the period of time is one of: a predefined period of time or a period of time determined based on a pre-defined statistics condition for the set of condition flags.

The above summary is provided merely for purposes of summarizing some example embodiments to provide a basic understanding of some aspects of the present invention. Accordingly, it will be appreciated that the above-described embodiments are merely examples and should not be construed to narrow the scope or spirit of the present invention in any way. It will be appreciated that the scope of the present invention encompasses many potential embodiments in addition to those here summarized, some of which will be further described below.

BRIEF DESCRIPTION OF THE DRAWINGS

Having thus described the disclosure in general terms, reference will now be made to the accompanying drawings, which are not necessarily drawn to scale, and wherein:

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein are not provided to convey any qualitative assessment, but instead merely to convey an illustration of an example. Thus, use of any such terms should not be taken to limit the spirit and scope of embodiments of the present invention.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices/entities, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some exemplary embodiments, retrieval, loading, and/or execution may be performed in parallel such that multiple instructions are retrieved, loaded, and/or executed together. Thus, such embodiments can produce specifically-configured machines performing the steps or operations specified in the block diagrams and flowchart illustrations. Accordingly, the block diagrams and flowchart illustrations support various combinations of embodiments for performing the specified instructions, operations, or steps.

Optical and electrical communication systems generally include a transmitter, a receiver, and a channel. The transmitter generates an optical signal conveying information, which, after being transmitted over a channel, is received and recovered at the receiver. For optical based communications such as communications using VCSELs, EMLs, or DMLs, the lasers utilized are nonlinear laser sources. Upcoming approaches in transmitters, such as integrated silicon photonic circuits containing Mach-Zehnder or micro-ring modulators driven by external continuous wave laser sources, also present such nonlinearities, by way of example, in the form of eye compression. Further, in the real world, transmission channels are non-ideal and introduce further nonlinearities due to reflections, linear channel impairments, or the like. Therefore, when the nonlinear laser sources are used to encode information in a signal with a multitude of amplitude levels (such as PAM-4) and transmit such signals via a nonlinear transmission channel, the integrity of the communication may be compromised.

Lookup table circuits with configurable lookup table values are used in an optical transmitter to compensate for these nonlinearities. The lookup table circuits utilizes a suitable set of lookup table values to implement optimization into the optical transmitter. For a PAM-4 signal, the input for the lookup table circuits is a sequence of three symbol values (0, 1, 2, and 3 for PAM-4, totaling 64 combinations) which may be referred to as a triplet. The output of the lookup table circuit is a digital word for the drive level. In some embodiments, the lookup table circuit can have a longer sequence of symbols as inputs. A suitable set of lookup table values may be needed to compensate for process variations. For a PAM-x signal with an input sequence length of K, the number of indexes in a lookup table may be M, which may be less than or equal to x^K (x to the power K). If M is less than x^K, more than one sequence of symbols may be mapped to the same lookup table index.

For the purpose of finding a suitable set of lookup table values, dedicated high cost measurement equipment having a high-speed sampling scope with pattern lock or a real-time scope with large memory are commonly utilized. The cost of such measurement equipment is typically in the $100,000 to ~$300,000 U.S. dollar range. The cost of such measurement equipment imposes a large cost and a heavy burden on the production and application of optical and electrical communication systems. Therefore, a solution for finding a suitable set of lookup table values without using dedicated measurement equipment would be beneficial.

Example embodiments of the present disclosure may be utilized for finding a set of lookup table values for a transmitter, such as the transmitter described in U.S. application Ser. No. 15/942,043, which is hereby incorporated by reference herein.

Figure 1:
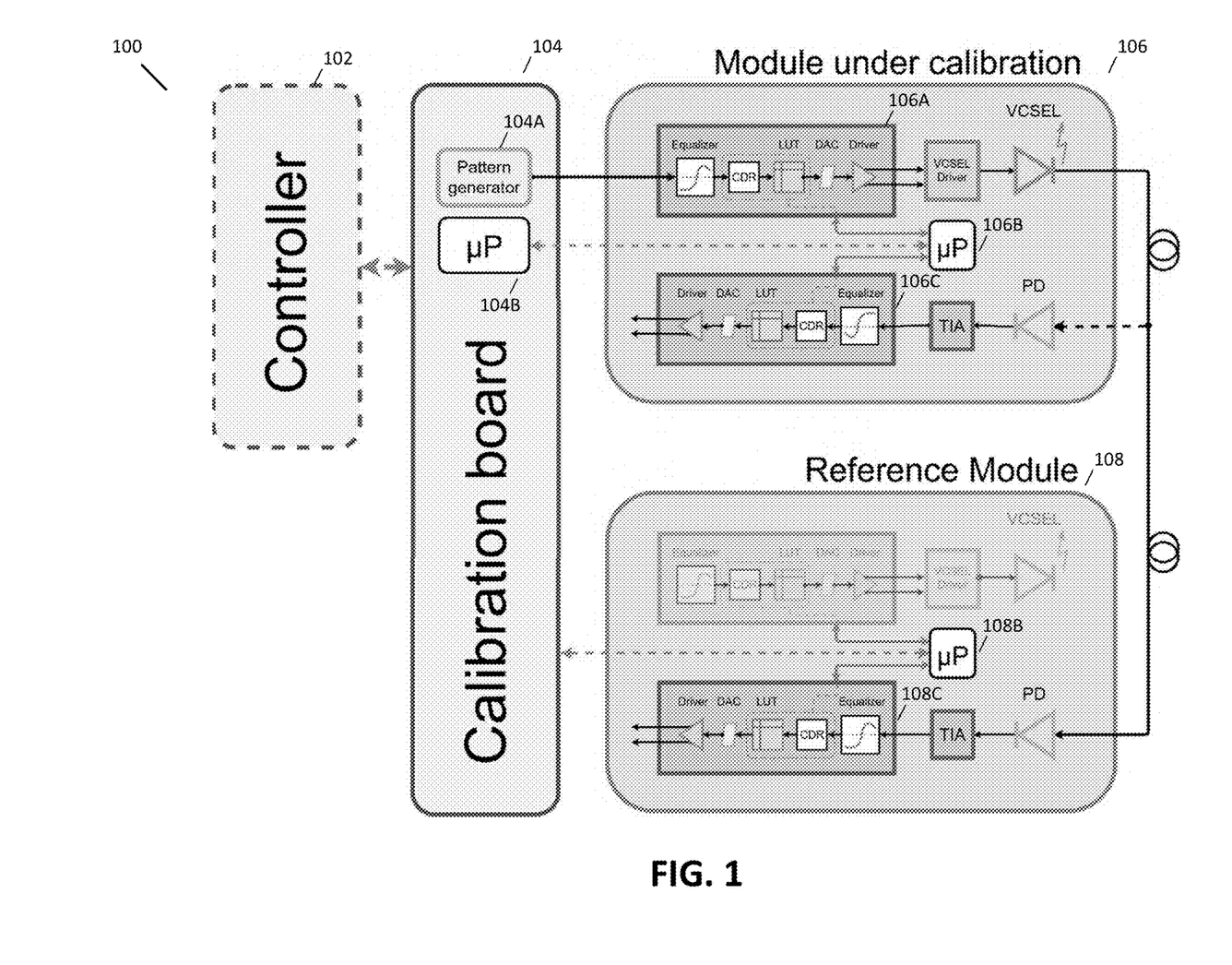
FIG. 1 illustrates an example system setup for tuning a lookup table circuit in a module under calibration according to example embodiments of the present invention.

FIG. 1 illustrates an example system setup for tuning a lookup table circuit in a module under calibration 106 within a transmitter of an optical and electrical communication system according to example embodiments of the present invention. In some embodiments, the transmitter may be embedded on a system on a chip. In some embodiments, certain components of the system 100 may be embedded within the transmitter. In the system 100 illustrated in FIG. 1, a calibration board 104, a module under calibration 106, and a reference module 108 is included. The system 100 may further include an external controller 102.

The calibration board 104 may include a pattern generator 104A and a microprocessor 104B. The pattern generator 104A is configured to generate a calibration signal which may take the form of an electrical signal. The calibration signal may be one of: a pseudorandom binary sequence (PRBS) signal, a short stress pattern random quaternary (SSPRQ) signal, or a signal with a custom pattern with overrepresentation of a set of pre-defined symbol sequence(s) based on user preference. In an example embodiment, the calibration signal is used in the process of tuning a lookup table circuit in the module under calibration 106. The calibration board 104 further includes a microprocessor 104B.

The module under calibration 106 may be a module in an optical and electrical communication system that includes a transmitter embedded with a lookup table circuit that needs tuning of lookup table values. In the depicted embodiment, the module under calibration 106 includes a transmitting module 106A, a microprocessor 106B, and a receiving module 106C. In example embodiments, the transmitting module 106A includes an equalizer, a clock data recovery unit (CDR), a lookup table circuit, and a digital to analog converter. The output of the digital to analog converter may be used to drive a laser driver circuit, such as a VCSEL driver, which drives a laser, such as a VCSEL laser. According to the depicted embodiment, the laser is a VCSEL, however, other lasers such as EMLs and DMLs may also be utilized. The module under calibration 106 may further include a receiving module 106C that receives input from a transimpedance amplifier (TIA) which receives input from a photodiode chip which converts an optical signal to an electrical signal.

Figure 4A:
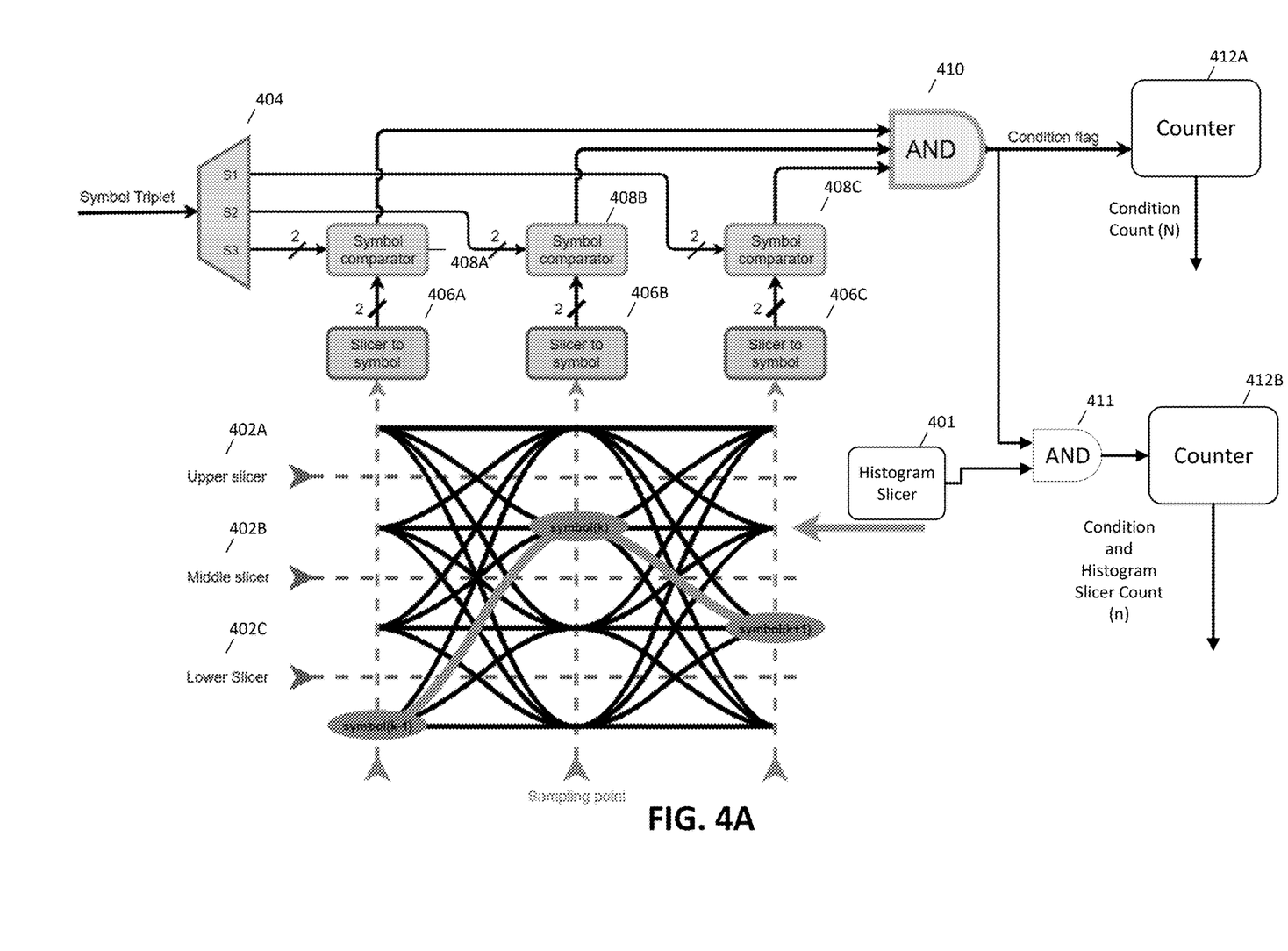
FIG. 4A illustrates an example detector according to example embodiments of the present invention.
Figure 4B:
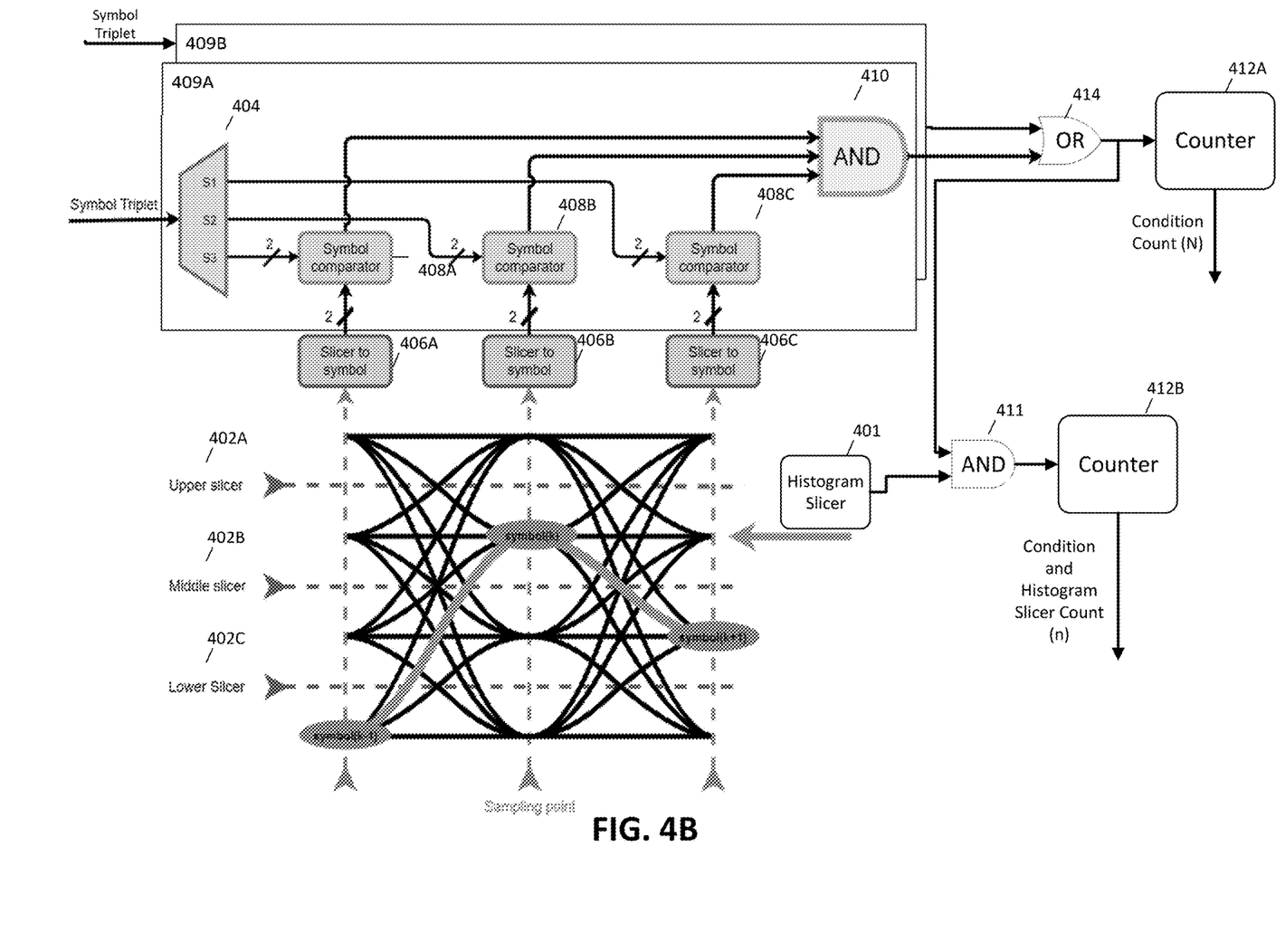
FIG. 4B illustrates another example detector according to example embodiments of the present invention.

The module under calibration 106 may be connected to a reference module 108 via an optical link. The reference module 108 may include a microprocessor 108B and a receiving module 108C. The receiving module 108C may receive input from a transimpedance amplifier (TIA) which receives input from a photodiode chip that converts an optical signal to an electrical signal. The optical signal received by the photodiode chip in the reference module 108C may be received from the transmitting module 106A of the module under calibration 106. The reference module 108 may also receive the calibration signal from the calibration board 104, for example, via electrical communication between the microprocessors. The receiving module 108C may include a detector used in the tuning process. In some embodiments, the detector may be included as part of the CDR unit. Details regarding the detector are described hereinafter in conjunction with FIG. 4. In some embodiments, the receiving module 108C and the reference module 108 may be integrated with the module under calibration 106, such as via an optical loop-back.

Figure 2:
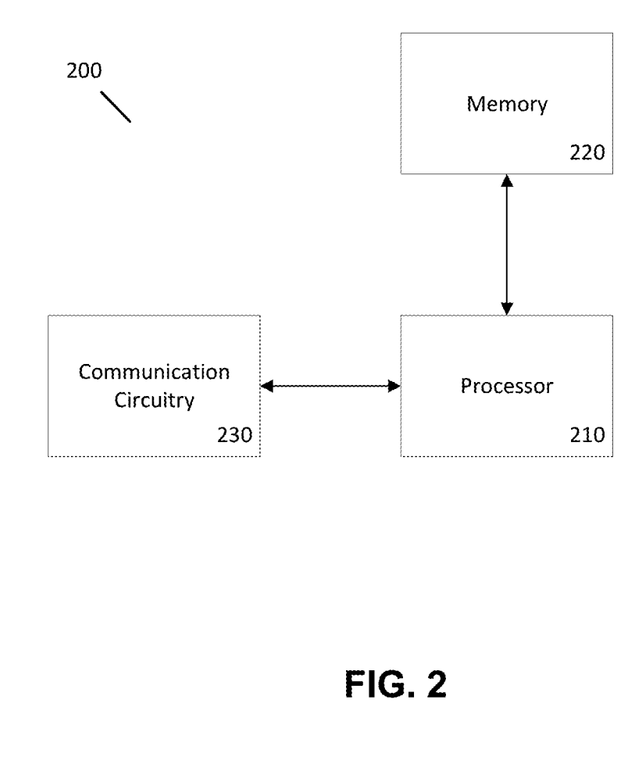
FIG. 2 illustrates an example computing system that may be used to embody the microprocessors and/or the controller according to example embodiments of the present invention.

FIG. 2 illustrates an example computing system 200 that may be used to embody the microprocessors and/or the controller 102. The computing system 200 may include or otherwise be in communication with a processor 210, memory circuitry 220, and communication circuitry 230. In some embodiments, the processor 210 (which may include multiple or co-processors or any other processing circuitry associated with the processor) may be in communication with the memory circuitry 220. The memory circuitry 220 may comprise non-transitory memory circuitry and may include one or more volatile and/or non-volatile memories. In some examples, the memory circuitry 220 may be an electronic storage device (e.g., a computer readable storage medium) configured to store data that may be retrievable by the processor 210. In some examples, the data stored in the memory 220 may include a pattern of a calibration signal, a set of condition counts and statistics derived from the condition flags, or the like for enabling the apparatus to carry out various functions or methods in accordance with embodiments of the present invention, described herein. A condition flag may be a binary value indicating whether a signal is above a pre-defined level of a histogram sliced by a histogram slicer.

In some examples, the processor 210 may be embodied in a number of different ways. For example, the processor may be embodied as one or more of various hardware processing means such as a microprocessor, a coprocessor, a digital signal processor (DSP), a controller, or a processing element with or without an accompanying DSP. The processor 210 may also be embodied in various other processing circuitry including integrated circuits such as, for example, an FPGA (field programmable gate array), a microcontroller unit (MCU), an ASIC (application specific integrated circuit), a hardware accelerator, or a special-purpose electronic chip. Furthermore, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining, and/or multi-threading. In some embodiments, the processor 210 is a microprocessor.

In an example embodiment, the processor 210 may be configured to execute instructions, such as computer program code or instructions, stored in the memory circuitry 220 or otherwise accessible to the processor 210. Alternatively or additionally, the processor 210 may be configured to execute hard-coded functionality. As such, whether configured by hardware or software instructions, or by a combination thereof, the processor 210 may represent a computing entity (e.g., physically embodied in circuitry) configured to perform operations according to an embodiment of the present invention described herein. For example, when the processor 210 is embodied as an ASIC, FPGA, or similar, the processor may be configured as hardware for conducting the operations of an embodiment of the invention. Alternatively, when the processor 210 is embodied to execute software or computer program instructions, the instructions may specifically configure the processor 210 to perform the algorithms and/or operations described herein when the instructions are executed. However, in some cases, the processor 210 may be a processor of a device (e.g., a computing device) specifically configured to employ an embodiment of the present invention by further configuration of the processor by instructions for performing the algorithms and/or operations described herein. The processor 210 may further include a clock, an arithmetic logic unit (ALU) and logic gates configured to support operation of the processor 210, among other things.

The computing system 200 may optionally also include communication circuitry 230. The communication circuitry may be any means embodied in either hardware or a combination of hardware and software that is configured to receive and/or transmit data from/to a network and/or any other device or module in communication with the computing system 200. In this regard, the communication interface may include, for example, supporting hardware and/or software for enabling communications. As such, for example, the communication circuitry 230 may include a communication modem and/or other hardware/software for supporting communication via cable, universal serial bus (USB), integrated circuit receiver, or other mechanisms.

Figure 3:
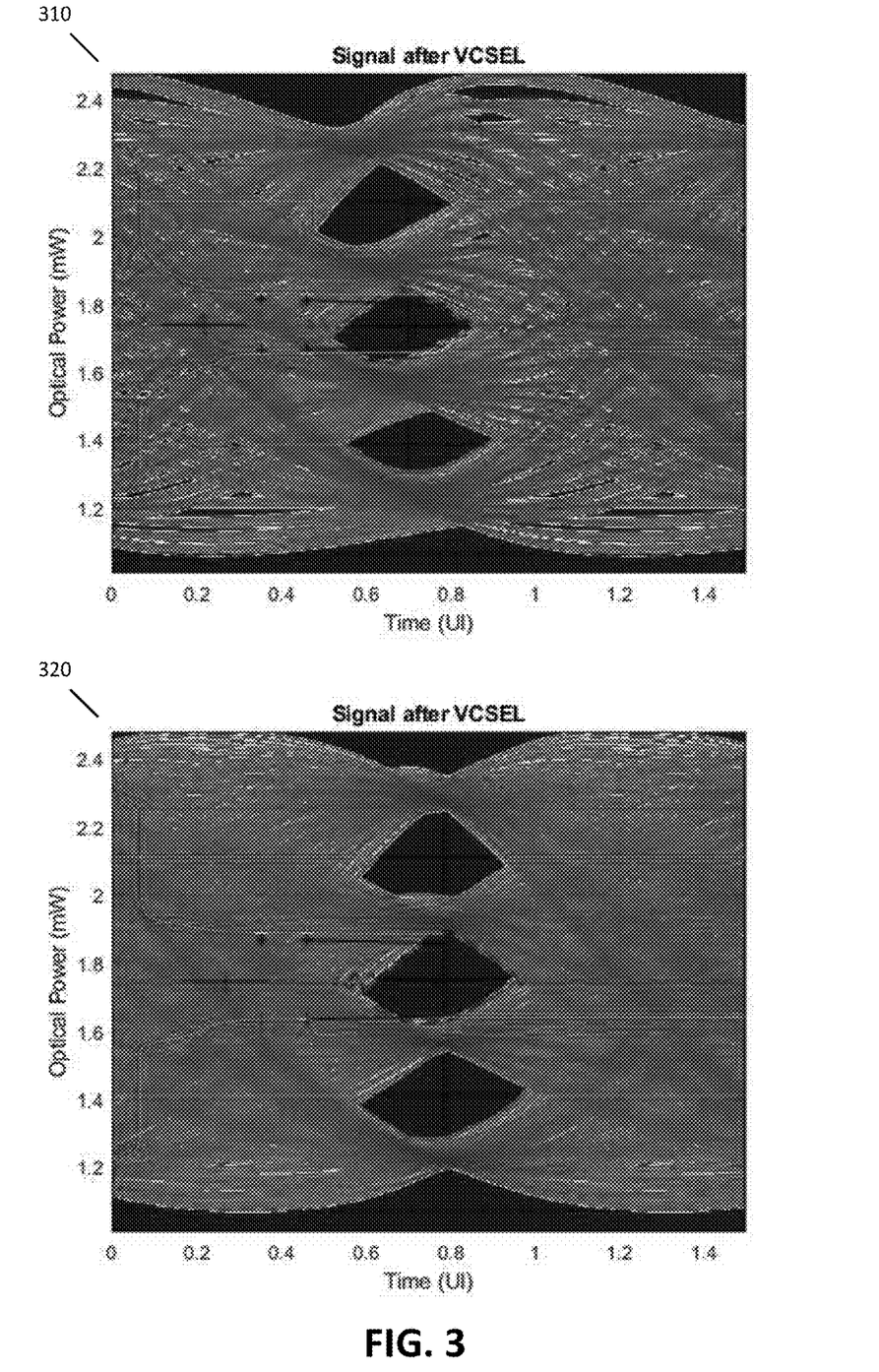
FIG. 3 illustrates a comparison of eye diagrams of signals generated by a VCSEL in a transmitter driven with and without application of embodiments of the present invention.

FIG. 3 illustrates a comparison of eye diagrams of signals generated by a VCSEL in a transmitter driven with and without application of embodiments of the present invention. Eye diagram 310 is an eye diagram of a signal generated by a VCSEL in a transmitter driven without application of embodiments of the present invention. As can be observed from the eye diagram 310, the ripples are relatively large, the eye sizes are not optimized, the eyes are misaligned, and the eyes are distorted. Eye diagram 320 is an eye diagram of signals generated by a VCSEL in a transmitter driven with application of embodiments of the present invention. As can be observed from the eye diagram 320, the ripples are smaller, the eyes are not distorted, the eyes are in better alignment, and the eye sizes are bigger, resulting in more accurate and efficient transmission of information.

FIG. 4A illustrates an example detector, for example, a detector in the reference module 108. Notably, even though the example detector illustrated in FIG. 4A is utilized with a PAM-4 signal encoded in triplets, such detector may be utilized in conjunction with other signals with modifications to the components, such as the number of the slicer modules and the number of the symbol comparators. For example, the detector may be utilized with a PAM-x signal detecting sequences of symbols of length K. In some embodiments, the module under calibration 106 has the detector implemented on the receiver 106C and the module under calibration 106 itself serves as the reference module, using optical loopback between the receiver 106C and the transmitter 106A.

As illustrated in FIG. 4A, the detector includes a histogram slicer 401 configured to slice an optical signal, such as a distorted signal generated by the module under calibration 106 in FIG. 1 based on the calibration signal. In some embodiments, the histogram slicer 401 may be set to a nominal value of the middle symbol of a triplet of the incoming distorted signal. In some embodiments, the detector further includes an upper slicer 402A, a middle slicer 402B, and a lower slicer 402C. Each of the upper slicer 402A, the middle slicer 402B, and the lower slicer 402C is configured to slice an eye of the distorted signal. In some embodiments utilized with a PAM-x signal, there are x−1 number of slicers 402 to slice the PAM-x signal.

In some embodiments, a full histogram is obtained by sweeping the slicer for the histogram utilizing histogram slicer 401. In some alternative embodiments, the incoming signal may be subsampled through an array of sample and hold circuit elements comprising G number of sample and hold circuit elements, and the histogram may be obtained by setting the histogram slicer levels in the G branches according to the histogram intervals, thereby counting all intervals simultaneously. Counting time may be G times longer and the correlation of slicer levels may result in an uncertainty. In this embodiment, the pattern symbol length of the calibration signal is not an integral multiplier of the number of branches. In some embodiments, the number G may be equal to 16. In some embodiments, a full histogram may be also be recorded.

In some other embodiments, the slicing is done by an analog to digital converter (ADC). For example, the ADC may be configured to perform 7 bit analog to digital conversion providing both the symbols going into the symbol comparators 406 and the input value to the histogram slicer 401.

After the upper slicer 402A, the middle slicer 402B, and the lower slicer 402C slice the eyes of the distorted signal, the outputs of the upper slicer 402A, the middle slicer 402B, and the lower slicer 402C are fed into the slice to symbol converters 406A, 406B, and 406C respectively to generate symbols according to the sliced eyes. In some embodiments, the number of slice to symbol converters is equal to the number of slicers. For example, if there are x−1 number of slicers, there may be x−1 number of slice to symbol converters. The slice to symbol converters 406A, 406B, and 406C may be configured to generate/recover symbols according to the eyes by utilizing various sampling schemes. In some embodiments, because the sliced eyes are sliced based on the distorted signal, the symbols generated are also distorted signal symbols that reflect various distortions in the distorted signal.

In some embodiments, the sampling phase can be adjusted per level, L, which indicates indexes with the symbol k equal to value L. The sampling point may be moved to a specific phase that reflects a predefined skew of the eyes which may be predefined based on preference for optimization. For example, optimization for a slight positive skew may be preferred if laser degradation over time reduces the skew.

In some embodiments, the distorted signal is encoded in triplet and the first symbol in the triplet is recovered by the slicer module 406A, the second symbol in the triplet is recovered by the slice to symbol converters 406B, and the third symbol is recovered by the slicer module 406C. After the slice to symbol converters 406A, 406B, and 406C generate/recover symbols according to the eyes, the symbols generated by the slice to symbol converters 406A, 406B, and 406C are fed into the symbol comparators 408A, 408B, and 408C. The symbol comparators 408A, 408B, and 408C may be configured to compare the symbols generated by the slice to symbol converters 406A, 406B, and 406C with, symbols received from the multiplexer 404. In some embodiments, the number of symbol comparators is equal to the number of slicer to symbol converters. In some embodiments, the multiplexer 404 is configured to receive a symbol triplet from the calibration board 104 illustrated in FIG. 1 and to output symbols in the symbol triplet to the symbol comparators 408A, 408B, and 408C. The symbol triplet received by the multiplexer 404 may correspond to a symbol triplet of an index to be filled (in one iteration) of a lookup table circuit.

In some embodiments, each of the symbol comparators 408A, 408B, and 408C may be embodied by XNOR gates and output "1" if the two symbols received, i.e., the symbol received from the slicer modules which is generated based on the distorted signal and the symbol received from the multiplexer which is generated based on the calibration signal, are equal.

The outputs of each of the symbol comparators 408A, 408B and 408C are fed into an AND gate 410. In some embodiments, the AND gate 410 may be replaced by other circuitries that performs similar functions of comparing symbols. In some embodiments, the AND gate 410 is configured to output 1 if all the outputs of each of the symbol comparators 408A, 408B and 408C are 1s, which indicates that the symbols generated based on the distorted signal are identical to the symbols generated based on the calibration symbol. The output of the AND gate 410 may be a condition flag that indicates whether the symbols generated based on the distorted signal for one particular triplet accurately reflects the calibration signal or not. The condition flag generated by the AND gate 410 may be fed into a counter 412A configured to count the condition flag for a period of time to generate a set of condition count. In some embodiments, the set of condition count may be stored by the microprocessor 108B and/or transmitted to the calibration board 104. The set of condition count may take the form of a total number of counts N.

The output of the AND gate 410 may also be fed into an AND gate 411 along with the output of the histogram slicer 401. The output of the AND gate 411 may then be fed into a counter 412B to generate a set of condition and histogram slicer count, which may be denoted by n. The 1's ratio of n/N may indicate the number of times the distorted signal triplets is above a pre-defined level of the histogram slicer.

In some embodiments, the period of time for generating a set of condition count for one observation of statistics for the is ratio may be a pre-defined period of time, a pre-defined number of symbols, or a period of time determined based on a pre-defined statistics condition for the set of condition flags, for example, a pre-defined number of total of is, N, or the like.

FIG. 4B illustrates an alternative implementation of the example detector, for example, a detector in the reference module 108. Notably, even though the example detector illustrated in FIG. 4A is utilized with a PAM-4 signal encoded in triplets, such detector may be utilized in conjunction with other signals with modifications to the components, such as the number of the slicer modules and the number of the symbol comparators. For example, the detector may be utilized with a PAM-x signal detecting sequences of symbols of length K. In some embodiments, the module under calibration 106 has the detector implemented on the receiver 106C and the module under calibration 106 itself serves as the reference module, using optical loopback between the receiver 106C and the transmitter 106A.

As illustrated in FIG. 4B, the detector also includes a histogram slicer 401 configured to slice an optical signal, such as a distorted signal generated by the module under calibration 108 in FIG. 1 based on the calibration signal. In some embodiments, the histogram slicer 401 may be set to a nominal value of the middle symbol of a triplet of the incoming distorted signal. In some embodiments, the detector also further includes an upper slicer 402A, a middle slicer 402B, and a lower slicer 402C. Each of the upper slicer 402A, the middle slicer 402B, and the lower slicer 402C is configured to slice an eye of the distorted signal. In some embodiments utilized with a PAM-x signal, there are x−1 number of slicers 402 to slice the PAM-x signal.

In some embodiments, a full histogram is obtained by sweeping the slicer for the histogram utilizing histogram slicer 401. In some alternative embodiments, the incoming signal may be subsampled through an array of sample and hold circuit elements comprising G number of sample and hold circuit elements, the histogram may be obtained by setting the slicer levels in the G branches according to the histogram intervals, thereby counting all intervals simultaneously. Counting time may be G times longer and the correlation of slicer levels may result in an uncertainty. In this embodiment, the pattern symbol length of the calibration signal is not an integral multiplier of the number of branches. In some embodiments, the number of G may be equal to 16. In some embodiments, a full histogram may be also be recorded.

In some other embodiments, the slicing is done by an analog to digital converter (ADC). For example, the ADC may be configured to perform 7 bit analog to digital conversion providing both the symbols going into the symbol comparators 406 and the input value to the histogram slicer 401.

After the upper slicer 402A, the middle slicer 402B, and the lower slicer 402C slice the eyes of the distorted signal, the outputs of the upper slicer 402A, the middle slicer 402B, and the lower slicer 402C are fed into the slice to symbol converters 406A, 406B, and 406C respectively to generate symbols according to the sliced eyes. In some embodiments, the number of slice to symbol converters is equal to the number of slicers. For example, if there are x−1 number of slicers, there may be x−1 number of slice to symbol converters. The slice to symbol converters 406A, 406B, and 406C may be configured to generate/recover symbols according to the eyes by utilizing various sampling schemes. In some embodiments, because the sliced eyes are sliced based on the distorted signal, the symbols generated are also distorted signal symbols that reflect various distortions in the distorted signal.

In some embodiments, the sampling phase can be adjusted per level, L, which indicates indexes with the symbol k equal to value L. The sampling point may be moved to a specific phase that reflects a predefined skew of the eyes which may be predefined based on preference for optimization. For example, optimization for a slight positive skew may be preferred if laser degradation over time reduces the skew.

In some embodiments, the distorted signal is encoded in triplet and the first symbol in the triplet is recovered by the slicer module 406A, the second symbol in the triplet is recovered by the slice to symbol converters 406B, and the third symbol is recovered by the slicer module 406C. In the alternative implementation illustrated in FIG. 4B, after the slice to symbol converters 406A, 406B, and 406C generate/recover symbols according to the eyes, the symbols generated by the slice to symbol converters 406A, 406B, and 406C are fed into the symbol comparators 408A, 408B, and 408C. The symbol comparators 408A, 408B, and 408C may be configured to compare the symbols generated by the slice to symbol converters 406A, 406B, and 406C with, symbols received from the multiplexer 404. In some embodiments, the number of symbol comparators is equal to the number of slicer to symbol converters. In some embodiments, the multiplexer 404 is configured to receive a symbol triplet from the calibration board 104 illustrated in FIG. 1 and to output symbols in the symbol triplet to the symbol comparators 408A, 408B, and 408C. The symbol triplets received by the multiplexer 404 may correspond to a symbol triplet of an index to be filled (in the current iteration) of a lookup table circuit.

In some embodiments, each of the symbol comparators 408A, 408B, and 408C may be embodied by XNOR gates and output "1" if the two symbols received, i.e., the symbol received from the slicer modules which is generated based on the distorted signal and the symbol received from the multiplexer which is generated based on the calibration signal, are equal.

The outputs of each of the symbol comparators 408A, 408B and 408C are fed into an AND gate 410. In some embodiments, the AND gate 410 may be replaced by other circuitries that performs similar functions of comparing symbols. In some embodiments, the AND gate 410 is configured to output 1 if all the outputs of each of the symbol comparators 408A, 408B and 408C are 1s, which indicates that the symbols generated based on the distorted signal are identical to the symbols generated based on the calibration symbol. Collectively, the multiplexer 404, symbol comparators 408A-C series, and the AND gate 410 may be referred to as a symbol sequence detection module 409. There may be multiple symbol sequence detection modules, such as 409A and 409B illustrated in FIG. 4B. Note that two symbol sequence detection modules are provided in FIG. 4B for illustration purpose. The symbol sequence detection modules in the depicted embodiment operate in parallel based on the outputs of the slicer and separate input symbol triplets to the multiplexer 404 of different symbol sequence detection modules 409A and 409B.

The outputs of the AND gate 410 of the symbol sequence detection modules 409A and 409B may be fed into an OR gate 414 to generate a condition flag. The condition flag generated by the OR gate 414 may be fed into a counter 412A configured to count the condition flag for a period of time to generate a set of condition counts, denoted by N.

The output of the OR gate 414, may also be fed into an AND gate 411 along with the output of the histogram slicer 401. The output of the AND gate 411 would be then fed into a counter 412B to generate a set of condition and histogram slicer count, which may be denoted by n. The 1's ratio of n/N indicates the number of times the distorted signal triplets is above a pre-defined level of the histogram slicer.

In this embodiment, because multiple triplets are processed at the same time, multiple indexes of the lookup table circuit may be filled in with the same value at the same time. In some embodiments, the lookup table circuit may be constructed in a way such that one value corresponds to multiple symbol triplets (for example, two symbol triplets that are inputs to the multiplexers of 409A and 409B).

In some embodiments, the period of time for generating a set of condition count for one observation of statistics for the is ratio may be a pre-defined period of time, a pre-defined number of symbols, or a period of time determined based on a pre-defined statistics condition for the set of condition flags, for example, a pre-defined number of total of is, N, or the like.

Figure 5:
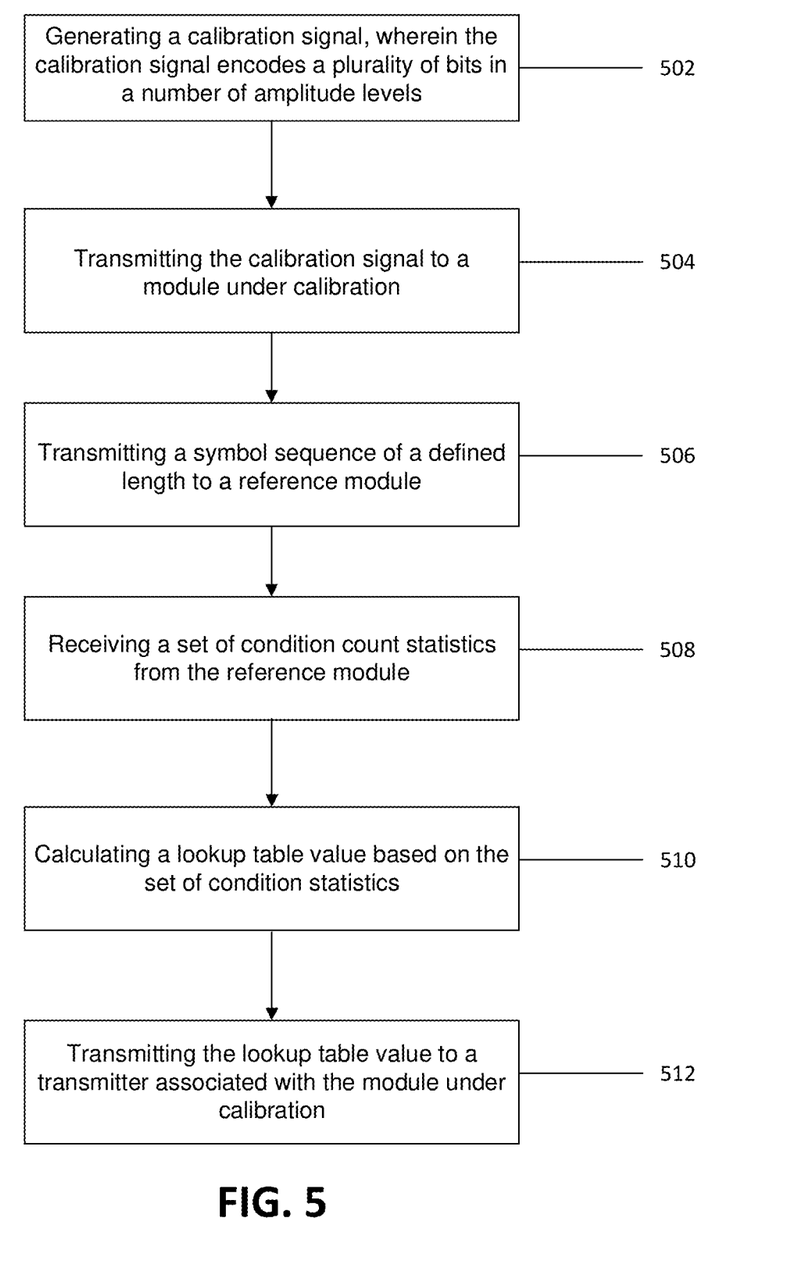
FIG. 5 is a flowchart illustrating an example method of generating a lookup table value for calibrating a lookup table circuit in an optical transmitter according to example embodiments of the present invention.

FIG. 5 is a flowchart illustrating an example method of generating a lookup table value for calibrating a lookup table circuit in an optical transmitter. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. In some embodiments, the example method illustrated in FIG. 5 is performed by the calibration board 104 and/or the controller 102 to calibrate a lookup table circuit in the transmitter of the module under calibration 106 illustrated in FIG. 1.

In some embodiments, at operation 502 illustrated in FIG. 5, the calibration board 104 in FIG. 1 generates a calibration signal, wherein the calibration signal encodes a plurality of bits in a number of amplitude levels. The calibration signal may be generated by the pattern generator 104A. The calibration signal may be one of: a pseudorandom binary sequence (PRBS) signal, a short stress pattern random quaternary (SSPRQ) signal, or a signal with a custom pattern with overrepresentation of a set of pre-defined symbol sequence(s) based on user preference.

In some embodiments, at operation 504, the calibration board 104 transmits the calibration signal to a module under calibration, such as the module under calibration 106. The module under calibration may include a transmitter that includes a lookup table circuit to be tuned. The lookup table circuit may be configured with a set of initial lookup table values. In some embodiments, the initial lookup table values may be transparent, i.e., the lookup table output is only dependent on one symbol in the triplet and the symbol value maps to a lookup table value. In some alternative embodiments, the initial lookup table values may be values from initial characterization of the design of the transmitter. In some other alternative embodiments, the initial lookup table values may be pre-defined custom values. The lookup table values stored in the lookup table circuit may be updated while tuning the lookup table circuit, such as after each iteration of the method illustrated in FIG. 5.

In some embodiments, at operation 506, the calibration board 104 transmits a symbol sequence of a defined length, such as a symbol triplet, to a reference module, such as the reference module 108 illustrated in FIG. 1. In some embodiments, a symbol triplet may be transmitted to the detector illustrated in FIG. 4A and FIG. 4B, such as to the multiplexer 404 of the detector illustrated in FIG. 4. In some embodiments, the slicers 402A-C (and other slicers, if applicable) in the detector receive the distorted signal. The symbol triplet received by the multiplexer 404 may correspond to a symbol triplet of an index to be filled (in the current iteration) of a lookup table circuit.

In some embodiments, at operation 508, the calibration board 104 receives a set of condition count statistics from the reference module, such as the reference module 108 illustrated in FIG. 1. The set of condition count statistics may be the condition count N and condition and histogram slicer count n generated by the counters 412A and 412B illustrated in FIG. 4A and FIG. 4B in accordance with the earlier descriptions in conjunction with FIG. 4A and FIG. 4B. In some embodiments, the condition count statistics may be n/N calculated by the reference module.

In some embodiments, instead of using a separate reference module, the module under calibration 106 itself serves as the reference module 108 where the detector is implemented on the receiver 106C of the module under calibration 106. In some embodiments, the microprocessor 108B controls the optical transmitter in the reference module 108 to transmit the condition count flags back to the detector in 106C; then the detector in 106C may generate the set of condition count statistics accordingly and transmit the set of condition count statistics back to calibration board 104.

In some embodiments, at operation 510, the calibration board 104 calculates a lookup table value based on the set of condition flags. In some embodiments, the lookup table value is calculated using the following formula:

$$LUT(t, i+1) = LUT(t, i) - \lambda\left(\frac{n}{N} - \frac{1}{2}\right)$$

For each iteration i, and for each index t of the lookup table value LUT(t, i), the next value LUT(t, i+1) is computed. The deviation from the figure of merit which may be indicated by the 1's ratio of $$\frac{n}{N}$$

compared to 1/2 (50%) is multiplied by a regularization coefficient 2 and added to the previous value in the lookup table value index. In some embodiments, the 50% may be changed to a different numerical value. In some embodiments, the regularization coefficient 2 may be a real number. In some embodiments where the look up table values are less than 100, 2 may be positive and less than 1. In some embodiments, the value of the regularization coefficient 2 may be pre-defined before the operations are performed.

In some embodiments, at operation 512, the calibration board 104 transmits the lookup table value to a transmitter associated with the module under calibration. A lookup table circuit in the transmitter may be updated with the lookup table value that was calculated. In some embodiments, after operation 512, the counters 412A and B illustrated in FIG. 4 may be reset.

All or selected steps of the method illustrated in FIG. 5, such as operations 504 to 512, may be repeated for a number of iterations, for example, until all values in the lookup table circuit in the transmitter is updated. For a PAM-x signal detector with sequence length of K, the number of indexes in a lookup table circuit may be M, which may be less than or equal to x^K (x to the power K). If M is less than x^K, more than one sequence of symbols may be mapped to the same lookup table index. In some embodiments, the lookup table circuit in the transmitter include M values so M steps are needed to update all values in the lookup table circuit. In some embodiments, the number of M is equal to 64.

In some embodiments, after all values in the lookup table circuit are met, the calibration board 104 may check if a stop condition for tuning the lookup table values is met. If the stop condition is met, the calibration board may transmit an indication that the tuning is complete. If the stop condition is not met, the calibration board may transmit an indication that the tuning is not complete and proceed to go through all or selected steps of the method illustrated in FIG. 5 for a number of iterations until all values in the lookup table circuit in the transmitter are updated once again. Accordingly, the lookup table values of the lookup table circuit in the transmitter are tuned to better address the nonlinearity issues of the laser source and the transmission channel.

In some embodiments, the stop condition is a fixed number of iterations of updating all values in the lookup table circuit. In some alternative embodiments, the stop condition is a defined statistic based on the error values.

The lookup table values may be decomposed into vectors of (Direct Current) DC, nonlinear and linear components. The linear part can be moved/copied, for example, to a receiver in the module under calibration 106, which may help lookup table values stay within limit without reducing output signal swing. The linear part may be further split into a part compensating for the linear imperfections of the module under calibration and the receiver. Other imperfections, such as the effect of fluctuation of temperatures, may be handled similarly through decomposition of the lookup table values.

Figure 6:
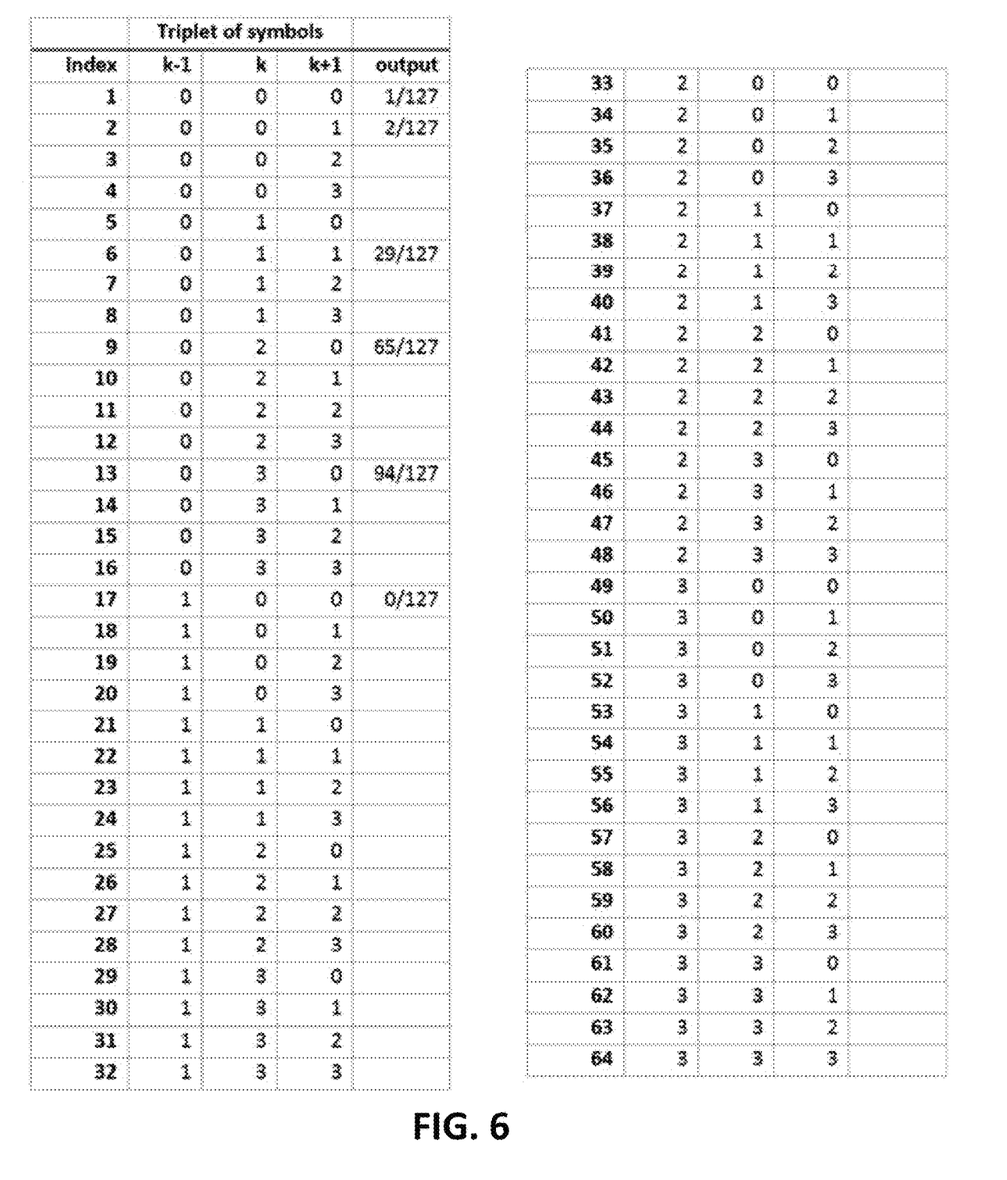
FIG. 6 illustrates an example table of lookup table values in a partially filled look up table for a PAM-4 signal in encoded in triplets.

FIG. 6 illustrates an example table of lookup table values in a partially filled look up table for a PAM-4 signal in encoded in triplets. In FIG. 6, the output value is nominally corresponding to the middle symbol value, # k. To introduce the desired compensation, the output will deviate with a relatively small value exemplified in some rows of the output column, where 127 represents maximum output for example values applicable for FIG. 6.

Figure 7:
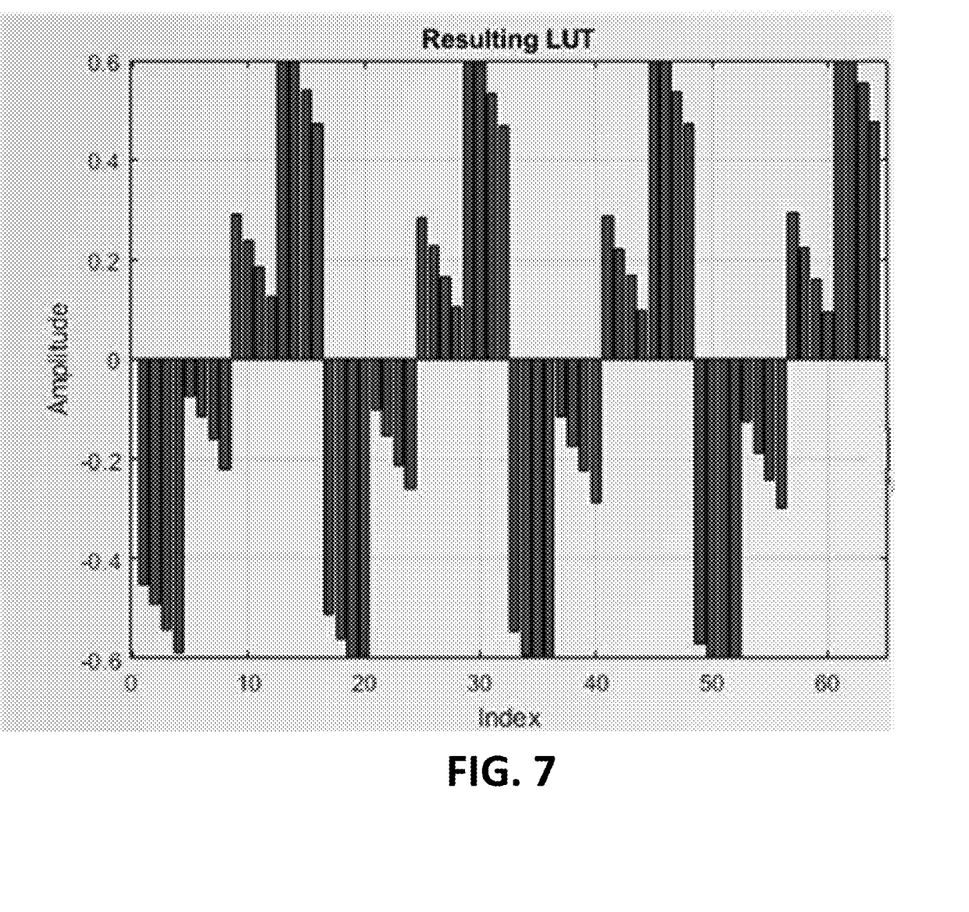
FIG. 7 is a graphical illustration of lookup table values in a lookup table for a PAM-4 signal encoded in triplets.

FIG. 7 is a graphical illustration of lookup table values in a lookup table for a PAM-4 signal encoded in triplets.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. A method for generating a lookup table value for calibrating a lookup table circuit in an optical transmitter, comprising:
generating a calibration signal, wherein the calibration signal encodes a plurality of bits in a number of amplitude levels;
transmitting the calibration signal to a module under calibration;
transmitting a symbol sequence with a defined length to a reference module, wherein the reference module is configured to compare the symbol sequence with the defined length with a distorted signal received from the module under calibration to generate a set of condition count statistics;
receiving the set of condition count statistics from a receiver in the reference module;
calculating a lookup table value based on the set of condition count statistics; and
transmitting the lookup table value to a transmitter associated with the module under calibration.

2. The method of claim 1, wherein the calibration signal is a pulse amplitude modulation signal encoding a plurality of symbols in four amplitude levels, and wherein the calibration signal is encoded in a plurality of triplets.

3. The method of claim 2, wherein the distorted signal comprises three eyes, and wherein the reference module comprises:
a histogram slicer configured to slice the distorted signal;
three slicer modules configured to slice the distorted signal to generate three distorted symbol values;
a detection module comprising:
three symbol comparators configured to compare three transmitted symbol values from the symbol sequence with the three distorted symbol values; and
a first AND gate configured to receive three outputs from the three symbol comparators, wherein an output of the first AND gate is a condition flag;
a first counter configured to count the condition flag over a period of time to generate a set of condition counts;
a second AND gate configured to receive the condition flag and an output of the histogram slicer; and
a second counter configured to count an output of the second AND gate.

4. The method of claim 2, wherein the distorted signal comprises three eyes, and wherein the reference module comprises:
a histogram slicer configured to slice the distorted signal;
three slicer modules configured to slice the distorted signal to generate three distorted symbol values;
one or more detection modules, wherein each detection module comprises:
three symbol comparators configured to compare three transmitted symbol values from the symbol sequence with the three distorted symbol values; and
a first AND gate configured to receive three outputs from the three symbol comparators;
an OR gate configured to receive an output of each of the first AND gates of the one or more detection modules, wherein an output of the OR gate is a condition flag;
a first counter configured to count the condition flag over a period of time to generate a set of condition counts;
a second AND gate configured to receive the condition flag and an output of the histogram slicer; and
a second counter configured to count an output of the second AND gate.

5. The method of claim 1, wherein the distorted signal is generated by the module under calibration based on the calibration signal.

6. The method of claim 4, wherein the period of time is one of: a predefined period of time or a period of time determined based on a pre-defined statistics condition for a set of condition flags.

7. The method of claim 1, wherein the method comprises generating sixty four lookup table values.

8. An apparatus for generating a lookup table value for calibrating a lookup table circuit in an optical transmitter, wherein the apparatus is configured to:
generate a calibration signal, wherein the calibration signal encodes a plurality of bits in a number of amplitude levels;
transmit the calibration signal to a module under calibration;
transmit a symbol sequence with a defined length to a reference module, wherein the reference module is configured to compare the symbol sequence with the defined length with a distorted signal received from the module under calibration to generate a set of condition count statistics;
receive the set of condition count statistics from a receiver in the reference module;
calculate a lookup table value based on the set of condition count statistics; and
transmit the lookup table value to a transmitter associated with the module under calibration.

9. The apparatus of claim 8, wherein the calibration signal is a pulse amplitude modulation signal encoding a plurality of symbols in four amplitude levels, and wherein the calibration signal is encoded in a plurality of triplets.

10. The apparatus of claim 9, wherein the distorted signal comprises three eyes, and wherein the reference module comprises:
a detection module comprising:
a histogram slicer configured to slice the distorted signal;
three slicer modules configured to slice the distorted signal to generate three distorted symbol values;
three symbol comparators configured to compare three transmitted symbol values from the symbol sequence with the three distorted symbol values; and
a first AND gate configured to receive three outputs from the three symbol comparators, wherein an output of the first AND gate is a condition flag;
a first counter configured to count the condition flag over a period of time to generate a set of condition counts;
a second AND gate configured to receive the condition flag and an output of the histogram slicer; and
a second counter configured to count an output of the second AND gate.

11. The apparatus of claim 9, wherein the distorted signal comprises three eyes, and wherein the reference module comprises:
a histogram slicer configured to slice the distorted signal;
three slicer modules configured to slice the distorted signal to generate three distorted symbol values;
one or more detection modules, wherein each detection module comprises:
three symbol comparators configured to compare three transmitted symbol values from the symbol sequence with the three distorted symbol values; and
a first AND gate configured to receive three outputs from the three symbol comparators;
an OR gate configured to receive an output of each of the first AND gates of the one or more detection modules, wherein an output of the OR gate is a condition flag;
a first counter configured to count the condition flag over a period of time to generate a set of condition counts;
a second AND gate configured to receive the condition flag and an output of the histogram slicer; and
a second counter configured to count an output of the second AND gate.

12. The apparatus of claim 8, wherein the distorted signal is generated by the module under calibration based on the calibration signal.

13. The apparatus of claim 11, wherein the period of time is one of: a predefined period of time or a period of time determined based on a pre-defined statistics condition for a set of condition flags.

14. The apparatus of claim 8, wherein the apparatus is configured to generate sixty four lookup table values.

15. An apparatus for generating condition statistics used for generating a lookup table value for calibrating a lookup table circuit in an optical transmitter comprising:
a histogram slicer configured to slice a distorted signal;
three slicer modules configured to slice the distorted signal to generate three distorted symbol values;
a detection module comprising:
three symbol comparators configured to compare three transmitted symbol values from a symbol triplet with the three distorted symbol values; and
a first AND gate configured to receive three outputs from the three symbol comparators, wherein an output of the first AND gate is a condition flag;
a first counter configured to count the condition flag over a period of time to generate a set of condition counts;
a second AND gate configured to receive the condition flag and an output of the histogram slicer; and
a second counter configured to count an output of the second AND gate.

16. The apparatus of claim 15, wherein a calibration signal associated with the detection module is a pulse amplitude modulation signal encoding a plurality of symbols in four amplitude levels, and wherein the calibration signal is encoded in a plurality of triplets.

17. The apparatus of claim 16, wherein the distorted signal comprises three eyes.

18. The apparatus of claim 15, wherein the period of time is one of: a predefined period of time or a period of time determined based on a pre-defined statistics condition for a set of condition flags.

19. The method of claim 1, wherein the reference module is integrated with the module under calibration via an optical loop-back.

20. The apparatus of claim 8, wherein the reference module is integrated with the module under calibration via an optical loop-back.

* * * * *